(12) United States Patent
Tazima et al.

(10) Patent No.: US 7,723,732 B2
(45) Date of Patent: May 25, 2010

(54) SEMICONDUCTOR LIGHT-EMITTING DEVICE AND MANUFACTURING METHOD THEREOF

(75) Inventors: Mikio Tazima, Tokyo (JP); Yoshiki Tada, Niiza (JP)

(73) Assignee: Sanken Electric Co., Ltd., Saitama-ken (JP)

( * ) Notice: Subject to any disclaimer, the term of this patent is extended or adjusted under 35 U.S.C. 154(b) by 0 days.

(21) Appl. No.: 11/936,267

(22) Filed: Nov. 7, 2007

(65) Prior Publication Data
US 2008/0128716 A1    Jun. 5, 2008

(30) Foreign Application Priority Data
Dec. 4, 2006    (JP) .............................. 2006-327294

(51) Int. Cl.
*H01L 33/00*    (2006.01)
(52) U.S. Cl. .............................. 257/79; 257/98; 257/88; 257/E33.074; 257/E33.068; 257/E33.069; 257/E33.067; 257/E33.055; 257/E33.07; 257/E33.071; 438/22; 438/29; 438/42; 438/31; 438/39; 438/33; 313/498; 250/552
(58) Field of Classification Search .................. 257/79, 257/98, E33.069, E33.07, E33.068, E33.071, 257/E33.074, E33.067, E33.055; 438/22, 438/29, 42, 39, 33; 250/552; 313/498
See application file for complete search history.

(56) References Cited

U.S. PATENT DOCUMENTS

| 5,284,792 | A | * | 2/1994 | Forster et al. .................. 438/29 |
| 2006/0181828 | A1 | * | 8/2006 | Sato et al. .................. 361/91.1 |
| 2006/0193355 | A1 | * | 8/2006 | Tazima et al. .................. 372/31 |
| 2006/0202219 | A1 | * | 9/2006 | Ohashi et al. .................. 257/98 |

FOREIGN PATENT DOCUMENTS

JP    2006-237467    7/2006

* cited by examiner

*Primary Examiner*—A. Sefer
*Assistant Examiner*—Ermias Woldegeorgis
(74) *Attorney, Agent, or Firm*—Wood, Herron & Evans, LLP

(57) ABSTRACT

A semiconductor light-emitting device includes a substrate having two main surfaces; and an active layer forming part, which is made of a compound semiconductor material, formed on one of the main surfaces, and includes an active layer. A plurality of holes, which pass through the active layer, are formed from the upper surface of the active layer forming part; a plurality of hollow parts, each of which corresponds to each hole, are provided between the active layer and the substrate; and the area of each hollow part is larger than that of the corresponding hole in plan view, and spreads on the lower surface of the active layer forming part, so as to expose a part of the lower surface of the active layer forming part, which overlaps the hollow part in plan view.

7 Claims, 7 Drawing Sheets

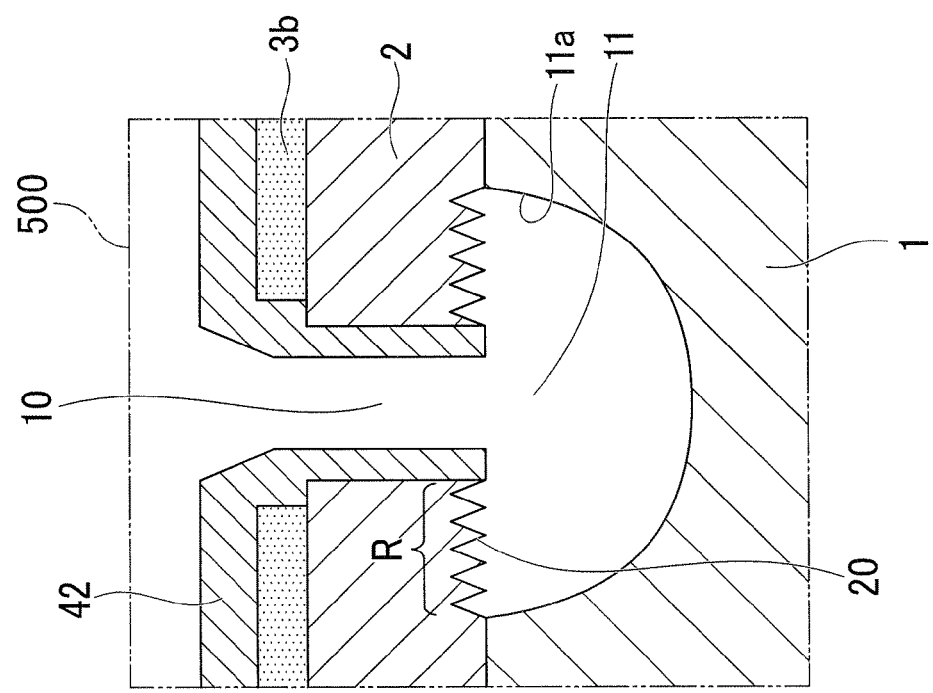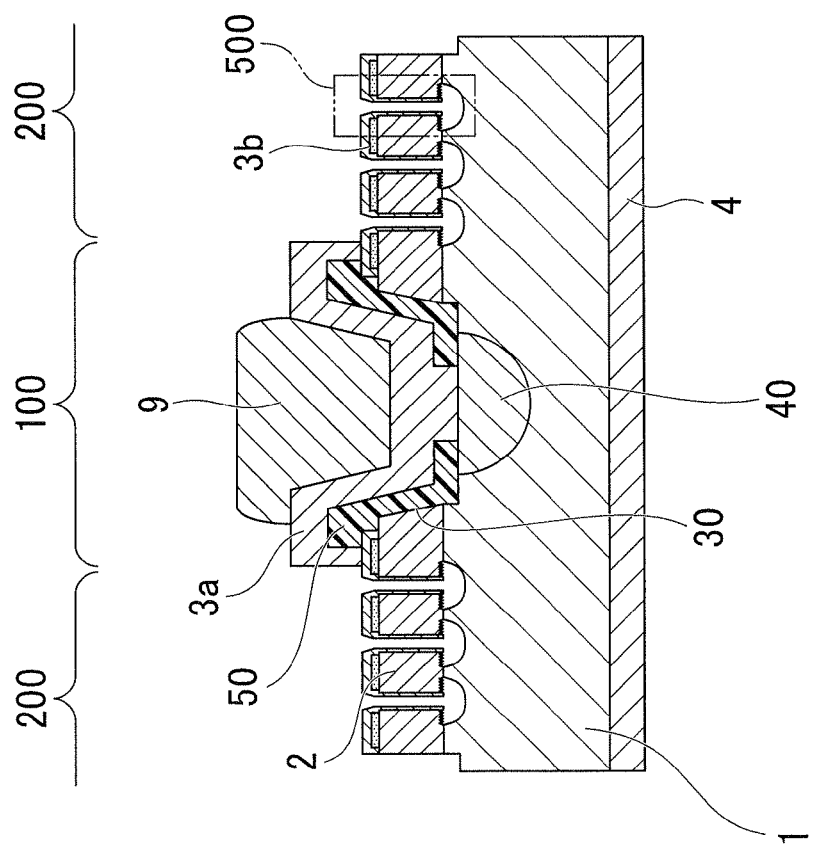
FIG. 9A
FIG. 9B

SEMICONDUCTOR LIGHT-EMITTING DEVICE AND MANUFACTURING METHOD THEREOF

BACKGROUND OF THE INVENTION

1. Field of the Invention

The present invention relates to a semiconductor light-emitting device using a nitride compound semiconductor, and to a manufacturing method thereof.

Priority is claimed on Japanese Patent Application No. 2006-327294, filed Dec. 4, 2006, the content of which is incorporated herein by reference.

2. Description of the Related Art

Recently, in various technical fields, techniques using light have been commonly used, and semiconductor light-emitting devices such as a GaN-type blue LED have been used as a device for emitting light.

Although such semiconductor light-emitting devices may use a light-transmitting substrate such as a substrate made of sapphire or silicon carbide, a silicon (Si) substrate may be used in consideration of cost reduction. However, silicon substrates do not transmit light. Therefore, light, which is emitted from an active layer and reaches a silicon substrate, does not pass through the silicon substrate, and is absorbed as heat or the like.

As a result, among the light emitted from the active layer, a light element, which is directed upward (i.e., to the side opposite to the silicon substrate), can be extracted, but a light element, which is directed downward (i.e., toward the silicon substrate), is absorbed as described above, and thus cannot be extracted.

Therefore, when using a silicon substrate, the output signal has a power of only ¼ to ⅕ of that obtained when using a light-transmitting substrate.

In consideration of such a problem, a structure has been disclosed, which has a substrate and a light-emitting part provided on one of main surfaces of the substrate, wherein a recessed part is provided in at least a part of the one of the main surfaces, an electrically conductive layer is provided in the recessed part, and light emitted from the light-emitting part is reflected by the conductive layer (see, for example, Patent Document 1: Japanese Unexamined Patent Application, First Publication No. 2006-237467). In accordance with the disclosed structure, as the light emitted from the light-emitting part is reflected by the conductive layer, it is possible to reduce a light element absorbed by the silicon substrate. Additionally, as the reflected light is directed upward, it is possible to improve light extraction efficiency on the upper side.

In accordance with the diagram showing the structure of the semiconductor light-emitting device in Patent Document 1, the distance between the center part of the active layer and the conductive layer provided in the recessed part in the horizontal direction seems not so large. However, the actual sectional structure of the semiconductor light-emitting device has a thin-sheet form. Therefore, in comparison with the route of light which is directly directed upward, the route from the center part of the active layer to the conductive layer (provided on a side of the active layer) is very large in plan view.

Therefore, in the above conventional semiconductor light-emitting device, light, emitted from the center part of the active layer to the side thereof, may be consumed as heat before it reaches the conductive layer (for reflecting the light upward) in the recessed part, that is, during the traveling toward the conductive layer.

Also in the above conventional semiconductor light-emitting device, when light is reflected in the recessed part, a part of the optical energy of the light is absorbed at a boundary between the conductive layer and the silicon substrate, and the absorbed energy is transformed into heat.

Additionally, with respect to the semiconductor light-emitting device disclosed in Patent Document 1, when filling a recessed part (provided in at least a part of one of main surfaces of the silicon substrate) with a conductive layer, the material for the conductive layer should have (i) a relatively excellent adhesion with respect to the silicon substrate, and (ii) a higher reflectance in comparison with the surface of the silicon substrate. In addition, an embedding process for filling the recessed part with the conductive layer is also necessary. Therefore, the total manufacturing cost is increased.

SUMMARY OF THE INVENTION

In light of the above circumstances, an object of the present invention is to provide a semiconductor light-emitting device and a manufacturing method thereof, so as to obtain a larger amount of light emitted upward, that is, a higher light extraction efficiency in comparison with conventional devices, thereby reducing the manufacturing cost.

Therefore, the present invention provides a semiconductor light-emitting device comprising:

a substrate having two main surfaces; and an active layer forming part, which is made of a compound semiconductor material, formed on one of the main surfaces, and includes an active layer, wherein:

a plurality of holes, which pass through the active layer, are formed from the upper surface of the active layer forming part;

a plurality of hollow parts, each of which corresponds to each hole, are provided between the active layer and the substrate; and the area of each hollow part is larger than that of the corresponding hole in plan view, and spreads on the lower surface of the active layer forming part, so as to expose a part of the lower surface of the active layer forming part, which overlaps the hollow part in plan view.

In a typical example, each hollow part joins the corresponding hole;

a pad electrode is provided on the upper surface of the active layer forming part; and in plan view, the adjacent hollow parts in each direction from the pad electrode toward a side away therefrom contact each other.

Typically, the substrate does not transmit light emitted from the active layer.

In a preferable example, a pad electrode is provided on the upper surface of the active layer forming part; and in plan view, the density of the hollow parts is higher in the vicinity of the pad electrode, in comparison with a peripheral area of the semiconductor light-emitting device.

Typically, the substrate is a silicon substrate; and the active layer forming part is made using a nitride compound semiconductor.

In another preferable example, on the exposed part in the lower surface of the active layer forming part, a first uneven pattern having a multiple alternating peak-valley form is formed.

In this case, it is possible that:

a transparent electrode is provided on the upper surface of the active layer forming part; and the transparent electrode has a surface which includes a second uneven pattern having a multiple alternating peak-valley form, wherein in plan view, the width between each peak and its adjacent valley in the multiple alternating peak-valley form of the second uneven pattern is smaller in comparison with the first uneven pattern.

In another preferable example, a pad electrode is formed on the upper surface of the active layer forming part, and substantially at the center of the semiconductor light-emitting device in plan view;

a protective element for protecting the semiconductor light-emitting device from a high voltage which may break the device is formed below the pad electrode; and the active layer forming part is formed around the protective element.

The present invention also provides a method of manufacturing a semiconductor light-emitting device, comprising:

a first step of forming an active layer forming part, which includes an active layer, on one of two main surfaces of a substrate;

a second step of forming a hole which passes through the active layer; and a third step of forming a hollow part between the active layer forming part and the substrate, by using an etchant for etching the substrate from a part of the one of the two main surfaces thereof, wherein said part is exposed due to the hole formed in the second step.

In a preferable example, the method further comprise:

a fourth step of forming a first uneven pattern having a multiple alternating peak-valley form on a lower surface of the active layer forming part, which is exposed by the hollow part formed in the third step.

In another preferable example, the method further comprise:

a step of forming a transparent electrode on the upper surface of the active layer forming part, wherein:

on a boundary surface with respect to the transparent electrode, a second uneven pattern having a multiple alternating peak-valley form is formed, wherein in plan view, the interval between each peak and its adjacent valley in the multiple alternating peak-valley form of the second uneven pattern is smaller in comparison with the first uneven pattern.

In accordance with the present invention in which the hollow parts are provided below the active layer forming part, among light emitted from the active layer, a light element which is directed below the active layer forming part reaches the boundary surface between the hollow parts and the active layer forming part which is exposed due to the hollow parts. As the refractive index of the active layer forming part differs from that of air (the refractive index of air is smaller), the light is reflected by the above boundary surface, and the light direction is changed to an upward direction or a transverse direction (i.e., parallel to the surface of the substrate) with respect to the semiconductor light-emitting device. Therefore, it is possible to prevent the light from being absorbed by the substrate, and thus to efficiently direct the light to the upper side of the device. Accordingly, in comparison with the conventional devices, intensity of the extracted light can be larger.

Also in accordance with the present invention, when a part of light, which proceeds in a transverse direction, reaches the boundary surface between a hole formed in the active layer forming part and a relevant side face of the active layer forming part, the light is reflected by the boundary surface due to a difference between the refractive indices of the active layer forming part and air, similar to the boundary surface between the active layer forming part and the hollow parts.

Also in the present invention, when the light) which is reflected by the boundary surface between the active layer forming part and the hollow parts, reaches the boundary surface between a hole formed in the active layer forming part and a relevant side face of the active layer forming part, the light is reflected by the boundary surface, and can be efficiently directed to the upper side of the semiconductor light-emitting device.

Therefore, in the present invention, in accordance with the above-described reflection at the boundary surface between the exposed surface of the active layer forming part and the hollow parts, and also the reflection at the boundary surface between a side face of the active layer forming part and the relevant hole, it is possible to reduce the light which is directed downward or toward a side, and to increase the amount of light which is directed upward, thereby efficiently extracting light from the upper side of the semiconductor light-emitting device. Accordingly, in comparison with conventional examples, the intensity of light emitted from the semiconductor light-emitting device can be increased.

BRIEF DESCRIPTION OF THE DRAWINGS

FIG. 9A is a schematic diagram showing a sectional structure of a composite semiconductor device as a second embodiment in accordance with the present invention, and FIG. 9B is an enlarged view of a part 500 in FIG. 9A.

DETAILED DESCRIPTION OF THE INVENTION

The present invention relates to a light-emitting element, which has a substrate, and an active layer forming part formed on the upper surface thereof, wherein (i) a plurality of holes are formed from the upper surface of the active layer forming part in a manner such that they pass through the active layer forming part, and (ii) a plurality of hollow parts, each corresponding to each hole, are formed between the substrate and the active layer forming part including an active layer for emitting light. Among light emitted from the active layer, a light element which is directed downward is reflected by the boundary surface between each hollow part and the active layer forming part or/and the boundary surface between each hole and the active layer forming part, thereby efficiently extracting the light (emitted by the active layer) from the upper side of the semiconductor light-emitting device, and thus increasing the light intensity.

Hereinafter, embodiments in accordance with the present invention will be described with reference to the appended figures.

First Embodiment

Figure 1:
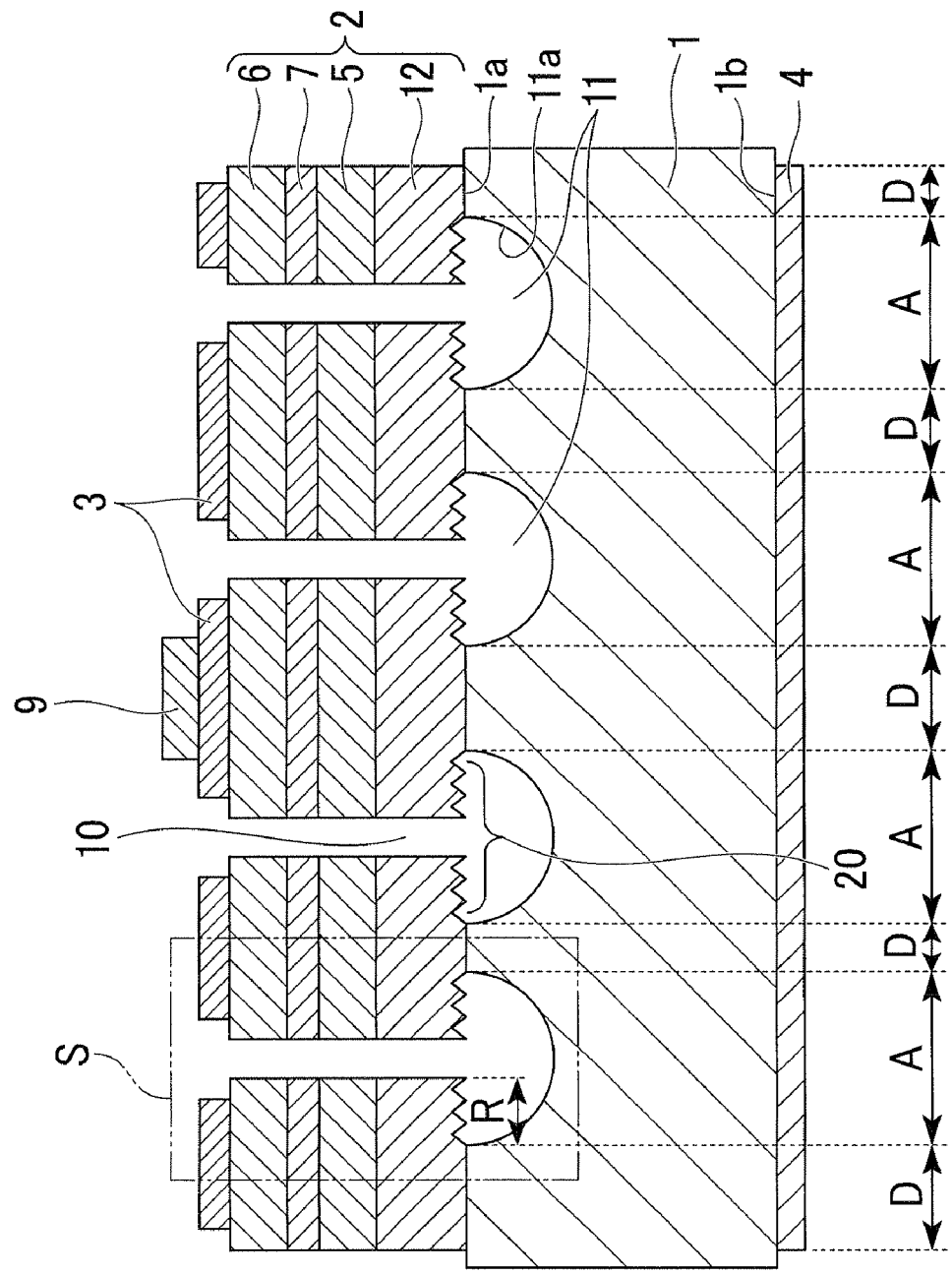
FIG. 1 is a schematic diagram showing a sectional structure (along line A-A in FIG. 4) of a semiconductor light-emitting device as a first embodiment in accordance with the present invention.
Figure 2:
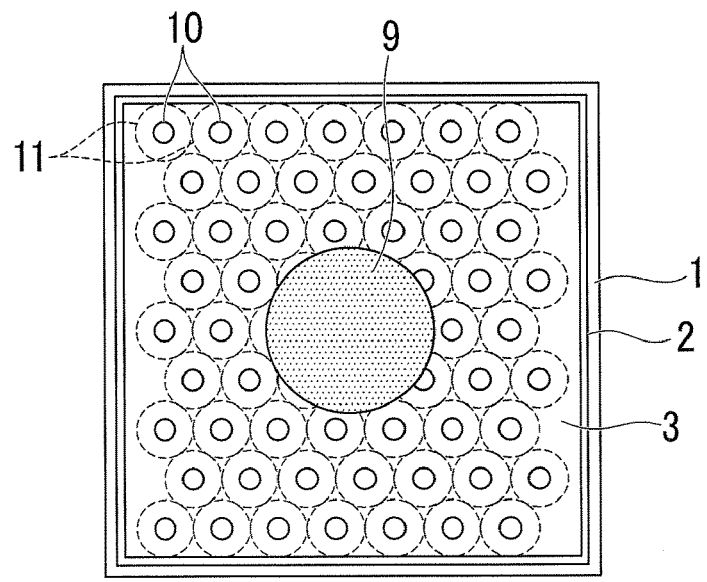
FIG. 2 is a schematic diagram showing a plan view structure of the semiconductor light-emitting device in the first embodiment.
Figure 3:
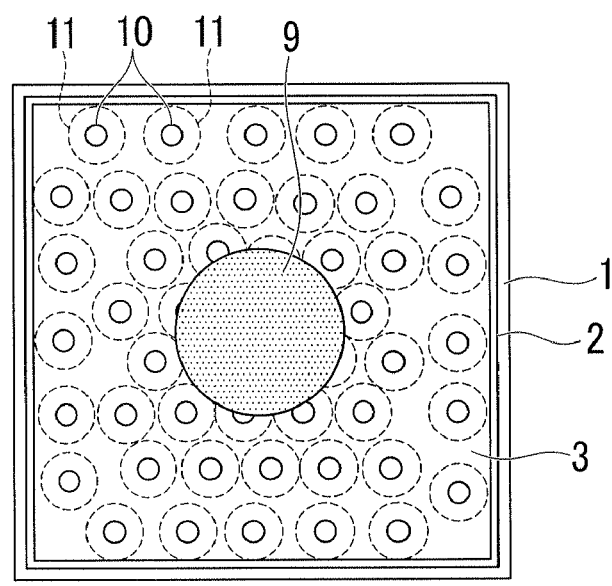
FIG. 3 is a schematic diagram showing another plan view structure of the semiconductor light-emitting device in the first embodiment.
Figure 4:
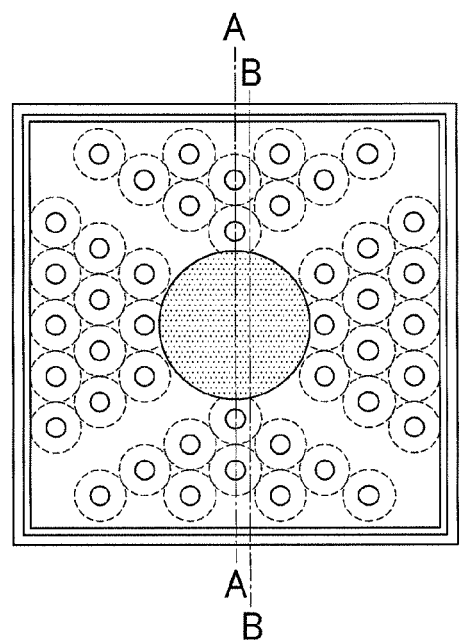
FIG. 4 is a schematic diagram showing another plan view structure of the semiconductor light-emitting device in the first embodiment.

Below, a first embodiment of the present invention will be explained. FIGS. 2 to 4 are plan views showing the structure of a semiconductor light-emitting device in the present embodiment, when the device is observed from above. FIG. 1 is a diagram showing a sectional structure of the semiconductor light-emitting device along line A-A in FIG. 4. Here, FIGS. 1 to 4 are schematic diagrams for showing the structure in an easily-understandable manner, and the size of each structural element in FIG. 1 does not accurately correspond to the relevant one in FIG. 4.

In FIG. 1, the present semiconductor light-emitting device has (i) a conductive substrate 1 having a main surface 1a (i.e., one of two main surfaces), and a main surface 1b (i.e., the other main surface), in which hollow parts 11 are formed in the main surface 1a, (ii) an active layer forming part 2 having a light-emitting function, (iii) a first electrode 3, (iv) a second electrode 4, (v) a pad electrode 9, and (vi) holes 10. The active layer forming part 2 includes a first cladding layer 5, a second cladding layer 6, and an active layer 5. In the semiconductor light-emitting device of FIG. 1, a protection film is not shown.

The conductive substrate 1 does not transmit light emitted from the active layer 5, and is a silicon substrate including silicon as a structural element. That is, it may be formed using silicon (Si) or silicon carbide (SiC), and has electric conductivity. The conductive substrate 1 functions as (i) a base on which the active layer forming part 2 (including a buffer layer 12) is deposited by epitaxial growth, (ii) a current passage for the semiconductor light-emitting device, and (iii) a part for holding the active layer forming part 2, the first electrode 3, and the like.

In order to reduce resistivity, the conductive substrate 1 may be made of a silicon material, which was subjected to doping so as to have a relatively high impurity concentration. For example, the conductive substrate 1 may be a silicon substrate which includes a Group 3 element such as boron (B), has a P-type impurity concentration of approximately $5 \times 10^{18}$ to $5 \times 10^{19}$ cm$^{-3}$, and also has a resistivity of 0.0001 to 0.01Ω·cm. In another example, the conductive substrate 1 may be an N-type conductive substrate including a Group 5 element such as phosphorus (P).

The conductive substrate 1 has the main surfaces 1a and 1b, and the main surface 1a may be a [111] surface with respect to the crystal plane direction, which is indicated using crystal indices. As the conductive substrate 1 functions as the base for forming the active layer forming part 2, that is, for holding the semiconductor light-emitting device, it is preferable that the thickness of the substrate may be 200 to 500 μm.

In the main surface 1a of the conductive substrate 1, recessed parts 11a are formed, each of which is curved and recessed from the main surface 1a toward the inside of the conductive substrate 1 (i.e., toward the main surface 1b). Below, when the semiconductor light-emitting device is observed in plan view from the side above the main surface 1a, the areas where the recessed parts 11a are formed are called "areas A", and the remaining areas where the recessed parts 11a are not formed are called "areas D". Although detailed explanations of the method of forming the recessed parts 11a will be provided later, after the active layer forming part 2 is formed on the main surface 1a of the conductive substrate 1, the active layer forming part 2 is etched to form the holes (or trenches) 10, and the main surface 1a, which is exposed through the holes 10, is subjected to isotropic etching, thereby forming the recessed parts 11a.

In accordance with the recessed parts 11a, which are formed below the active layer 7 and are each recessed toward the inside of the conductive substrate 1, the hollow parts 11 are formed between the active layer forming part 2 and the conductive substrate 1. That is, as the lower part of the active layer forming part 2 also exists in the area where the hollow parts 11 are formed, parts of the lower surface of the active layer forming part 2, which overlap with the hollow parts 11 in plan view, are exposed.

Here, the refractive index of the active layer forming part 2 differs from that of air. Therefore, among light emitted from the active layer 7, a light element which is directed downward from the active layer 7 is reflected by a first boundary surface between the exposed lower surface of the active layer forming part 2 and the hollow parts 11. The reflected light is directed upward, or in upward and transverse directions. Accordingly, it is possible to prevent the emitted light from being absorbed by the conductive substrate 1, and to improve the light extraction efficiency of the semiconductor light-emitting device.

Additionally, on the main surface 1a of the conductive substrate 1, the active layer forming part 2 is formed using a nitride compound semiconductor (i.e., a material different from the conductive substrate 1) by means of a CVD (chemical vapor deposition) method, or the like.

The active layer forming part 2 has a double-heterostructure formed by stacking at least the first cladding layer 5 having a first conductive type, the active layer 7, and the second cladding layer 6 having a second conductive type, which differs from the first conductive type.

The first cladding layer 5 is made of a nitride compound semiconductor which satisfies $Al_aM_bGa_{1-a-b}N$. Preferably, it is made of an n-type nitride compound semiconductor, such as GaN. In the above chemical formula of the nitride compound semiconductor, M indicates at least one element selected from among In (indium) and B (boron), and "a" and "b" satisfy "$0 \leq a \leq 1$", "$0 \leq b \leq 1$", and "$0 \leq (a+b) \leq 1$".

The active layer 7 is formed on the upper surface of the first cladding layer 5, and is made of a nitride compound semiconductor, which satisfies $Al_xIn_yGa_{1-x-y}N$, where $0 \leq x \leq 1$, $0 \leq y \leq 1$, and $0 \leq (x+y) \leq 1$.

In FIG. 1, the active layer 7 has a single-layer form. However, actually, it is preferable that the active layer 7 have a known multiple quantum-well (MQW) structure.

The active layer 7 may include P-type or N-type impurities for determining the conductive type.

The second cladding layer 6 is formed on the upper surface of the active layer 7, and is made of a nitride compound semiconductor, which satisfies $Al_hM_kGa_{1-h-k}N$, where $0 \leq h \leq 1$, $0 \leq k \leq 1$, and $0 \leq (h+k) \leq 1$. Preferably, the second cladding layer 6 includes P-type impurities, and may be made of GaN.

In the above-described active layer forming part 2, when applying a forward voltage between the first cladding layer 5 and the second cladding layer 6, carrier recombination occurs in the active layer 7, so that light is emitted from the active layer 7. When the active layer 7 is formed using $In_xGa_{1-x}N$ (where $0<x<0.2$), light having a wavelength of approximately 470 nm is emitted from the active layer 7.

In addition, the buffer layer 12 may be formed between the first cladding layer 5 and the conductive substrate 1. In FIG.

1, the buffer layer 12 is a signal layer. However, actually, a first (type) layer is deposited on the bottom, and a second (type) layer and the first layer are stacked alternately, so as to form a single or multiple pairs of the first and second layers. Preferably, the first layer is made of a nitride compound semiconductor including Al.

When the conductive substrate 1 is a silicon substrate, preferably, the first layer is made of AlN, which has a lattice constant close to that of single-crystal silicon, and can be relatively thickly deposited, as a nitride compound semiconductor, on the upper surface of the silicon substrate. Also preferably, the thickness of the first layer is 0.5 to 5 nm, which can produce a tunnel effect.

The second layer is provided for further improving the buffering function of the buffer layer 12 when being combined with the first layer 1. Preferably, the material for forming the second layer does not include Al, or includes less Al than the first layer. The second layer may be made of GaN.

The first electrode 3 is formed on almost the entire part of the upper surface of the second cladding layer 6, and is a transparent electrode, which can transmit light emitted from the active layer 7, and has a low resistance.

Preferably, the first electrode 3 is provided by forming an ITO (indium tin oxide) layer at a thickness of approximately 100 nm, where the ITO is formed by mixing a small amount (i.e., a few percent) of tin oxide ($SnO_2$) into indium oxide ($In_2O_3$).

When the second cladding layer 6 is made of a P-type semiconductor, the first electrode 3 may be made of one (i.e., metal) of or an alloy including one of nickel (Ni), platinum (Pt), palladium (Pd), rhodium (Rh), gold (Au), iridium (Ir), ruthenium (Ru), and osmium (Os). When the second cladding layer 6 is made of an N-type semiconductor, the first electrode 3 may be made of one (i.e., metal) of, or an alloy including one of aluminum (Al), titanium (Ti), gold (Au), chromium (Cr), and the like.

The second electrode 4 is formed on the almost entire part of the main surface 1b of the conductive substrate 1, and is formed by vacuum evaporation using metal such as (i) gold (Au), (ii) gold (Au) and germanium (Ge), (iii) gold (Au), germanium (Ge), and nickel (Ni), or the like. The second electrode 4 is mechanically and electrically connected to the conductive substrate 1. Although the second electrode 4 is formed on the main surface 1b of the conductive substrate 1, it may be formed on the main surface 1a if the main surfaces 1a and 1b have reverse functions to each other. In this case, the active layer forming part 2 and the hollow parts 11 are formed on the side of the main surface 1b.

The pad electrode 9 for connecting the semiconductor light-emitting device to an external device is formed at almost the center of the first electrode 3, and is made of gold (Au) or aluminum (Al). The pad electrode 9 is not formed on the entire part of the first electrode 3, and thus a part of the first electrode 3 is exposed on the outside of the pad electrode 9, when the semiconductor light-emitting device is observed in plan view. The pad electrode 9 must have a thickness by which the pad electrode 9 is not damaged by a bonding process for connecting a wire for external connection. For example, the thickness is 100 nm to 100 μm. Therefore, the pad electrode 9 does not transmit light emitted from the active layer 7. Even if the pad electrode 9 has an ability of transmitting a slight amount of the light, it is difficult for the pad electrode 9 to transmit the light when a wire for external connection is connected thereto.

Instead of the above-described structure, a known current diffusion layer or contact layer may be provided between the active layer forming part 2 and the first electrode 3. In addition, a known current blocking layer may be formed between the active layer 7 and the first layer 3, immediately below the pad electrode 9. Additionally, each conductive type of the conductive substrate 1, the first cladding layer 5, the active layer 7, and the second cladding layer 6 may be changed to the inverse type to that of the present embodiment.

The structure of the semiconductor light-emitting device of the present embodiment in plan view will be explained with reference to FIGS. 2 to 4.

As described above, in plan view, the plurality of the holes 10 are formed in the active layer forming part 2 from the upper surface thereof, which pass through the active layer 7, and the hollow parts 11 are formed by means of the recessed parts 11a, which are formed in the conductive substrate 1 so as to join the holes 10.

Each of the hollow parts 11 is formed by the lower surface of the active layer forming part 2 and the bottom part of the relevant recessed part 11a, and is disposed between the active layer forming part 2 and the conductive substrate 1. As shown by each of FIGS. 2 to 4, in plan view, each hollow part 11, the center of which coincides with the corresponding hole 10, surrounds the hole 10, and a part of the lower surface of the active layer forming part 2 overlaps with an outer area of the recessed part 11a. That is, the width of each hollow part 11 is larger than the corresponding hole 10, and the hollow part 11 reliably contains the area of the hole 10. Therefore, the area of the lower surface of the active layer forming part 2, which overlaps with each of the recessed parts 11a in plan view, is exposed by means of the relevant hollow part 11.

As shown in FIG. 2, the adjacent hollow parts 11 may contact each other in plan view. In this case, light, emitted downward from the active layer 7, is easily reflected by an exposed part R (i.e., a boundary surface between the active layer forming part 2 and the hollow parts 11) in the lower surface of the active layer forming part 2, due to a difference between the refractive indices of the active layer forming part 2 and air. Therefore, the light extraction efficiency with respect to the light emitted from the active layer 7 is improved, thereby also improving the light-emitting efficiency of the semiconductor light-emitting device.

With regard to known semiconductor light-emitting devices, when a forward voltage is applied between the pad electrode 9 and the second electrode 4, the passage of current, which flows immediately below the pad electrode 9, is short, and the larger the distance from the pad electrode 9, the longer the current passage. Therefore, the larger the distance from the pad electrode 9, the lower the light-emitting efficiency.

In the case in which the hollow parts 11 are formed around the pad electrode 9, when the hollow parts 11 contact each other in a direction along which the pad electrode 9 is surrounded (i.e., in a circumferential direction), light, observed from the side above the semiconductor light-emitting device, forms ring-shaped stripes (pattern). In contrast, when the hollow parts 11 contact each other in a direction from the pad electrode 9 toward the side away therefrom (i.e., in a radial direction), such a ring-shaped stripes pattern is not remarkable.

On the other hand, as shown in FIG. 3, the density of the hollow parts 11 in the vicinity of the pad electrode 9 may be higher than the density of the hollow parts 11 arranged on a peripheral part of the active layer forming part 2. As the pad electrode 9 is connected to external wiring, the thickness of the pad electrode 9 should be large, and thus the pad electrode 9 does not transmit light. When the density of the hollow parts 11 in the vicinity of the pad electrode 9 is higher than the density of the hollow parts 11 arranged on a peripheral (i.e., outer) part of the active layer forming part 2, the current passage in the vicinity of the area immediately below the pad electrode 9 can be narrower, so that in comparison with the conventional structure, the current flowing in the vicinity of the pad electrode 9 can be smaller, and the current flowing in an area distant from the pad electrode 9 can be larger.

In addition, as light, emitted immediately below the pad electrode 9, is reflected at a boundary surface between the active layer forming part 2 and the hollow parts 11, the amount of light absorbed by the conductive substrate 1 can be smaller. Furthermore, when the light, blocked by the pad electrode 9, is further reflected by the hollow parts 11, light can be extracted to the outside of the semiconductor light-emitting device, thereby improving the light-emitting efficiency of the semiconductor light-emitting device. Here, the width (i.e., diameter) of each hole 10 in plan view is 200 nm to 100 μm, preferably, 1 to 3 μm.

On the other hand, as shown in FIG. 4, an area where the holes 10 and the hollow parts 11 are provided and an area where the holes 10 and the hollow parts 11 are not provided may be formed and arranged in radial directions from the center to the periphery of the semiconductor light-emitting device, so as to prevent the mechanical strength of the semiconductor light-emitting device being degraded.

Below, improvement in the strength of emitted light of the semiconductor light-emitting device will be described, which is provided by forming the holes 10 (which pass through the active layer 7) and the hollow parts 11 (under the active layer forming part 2), and also forming the exposed part R (i.e., a boundary surface between the lower surface of the active layer forming part 2 and the hollow parts 11) in the lower surface of the active layer forming part 2 (i.e., of the buffer layer 12).

With respect to a part under the active layer forming part 2, when the hollow parts 11 are formed at the positions corresponding to the holes 10, a part of light, which is emitted downward from the active layer 7 (i.e., toward the conductive substrate 1), reaches a boundary face between the exposed part R (which is exposed at the lower surface of the active layer forming part 2 by means of the hollow parts 11) and the hollow parts 11 (i.e., air).

As the refractive indices of the active layer forming part 2 and air differ from each other, when the light from the active layer 7 reaches the above boundary surface, at least a part of the light can be reflected and directed upward (i.e., toward the upper part of the active layer forming part 2) or toward a side (i.e., in a transverse direction).

When the active layer forming part 2 is made using GaN, and the active layer 7 is made of $In_xGa_{1-x}N$ (where 0<x<0.2), light emitted from the active layer 7 has a wavelength of approximately 470 nm. Here, GaN has a refractive index of approximately 2.5, air has a refractive index of 1.0, and the conductive substrate, when it is a silicon substrate, has a refractive index of approximately 4.5. Therefore, in comparison with the light emitted from GaN (i.e., the active layer forming part 2) to a boundary surface between GaN and air (i.e., the hollow parts 11) with the light emitted from GaN to a boundary surface between GaN and the conductive substrate 1, reflection is more easily performed by the boundary surface between GaN and air.

In addition, the silicon substrate as the conductive substrate 1 must function as a base of the semiconductor light-emitting device, and thus has a considerable amount of thickness (200 to 500 μm). Therefore, the silicon substrate does not transmit light, and transforms incident light into heat, so as to absorb energy.

When the hollow parts 11 are formed so as to expose a part of the lower surface of the active layer forming part 2 and to form a boundary surface between the lower surface of the active layer forming part 2 and air, a part of light, which reaches this lower surface from above, can be reflected in a desirable manner, thereby changing the direction of light, that is, to an opposite direction (i.e., upward) or in a transverse direction.

Additionally, in the active layer forming part 2, a part having a light-emitting function is thin (i.e., has a small thickness) and has a larger length in comparison with the small thickness. Therefore, if a light-reflecting part is provided on an outer periphery of the active layer forming part 2 (as in conventional techniques), light, emitted from the center of the active layer forming part 2 in plan view, should be transmitted through a long passage, so as to extract the light to the outside. Every time the light is refracted, it consumes energy, thereby lowering the light extraction efficiency with respect to the light emitted from the active layer 7.

In contrast, in the semiconductor light-emitting device of the present embodiment, the light extraction efficiency with respect to the light emitted from the active layer 7 can be improved by the following processes (1) to (3).

(1) The hollow parts 11 are provided under the active layer forming part 2, so that a part of light, which is emitted downward from the active layer 7, that is, toward the conductive substrate 1, is reflected by the boundary surface R between the exposed lower surface of the active layer forming part 2 (exposed by means of the hollow parts 11) and air. Therefore, it is possible to change the light direction to an upward or transverse direction (with respect to the semiconductor light-emitting device), thereby suppressing the absorption at the conductive substrate 1.

(2) With regard to the above process (1), a part of the light, which is directed in a transverse direction, is reflected by a boundary surface between a side face (formed by means of the relevant hole 10) of the active layer forming part 2 and air, similar to the boundary surface between the lower surface of the active layer forming part 2 and air.

(3) The reflected light through the above process (2) then progresses upward by changing the light proceeding direction, That is, light, which progresses upward, can be easily obtained. Therefore, it is possible to prevent the energy of light, emitted from the active layer 7, from being consumed by severally-repeated reflection, thereby improving the light extraction efficiency.

Preferably, a first uneven pattern 20 (i.e., a multiple peak-valley form consisting of peak portions and valley portions which are alternately arranged) is formed on the exposed lower surface (corresponding to the above boundary surface R) of the active layer forming part 2. The first uneven pattern 20 includes a number of grooves, each of which may has an inverse pyramid or inverse circular-cone form, and has inclined faces with respect to the main surface 1a of the conductive substrate 1. The provided grooves need not have the same size, and a space (i.e., an area where no groove is present) may be present between adjacent grooves.

Figure 5:
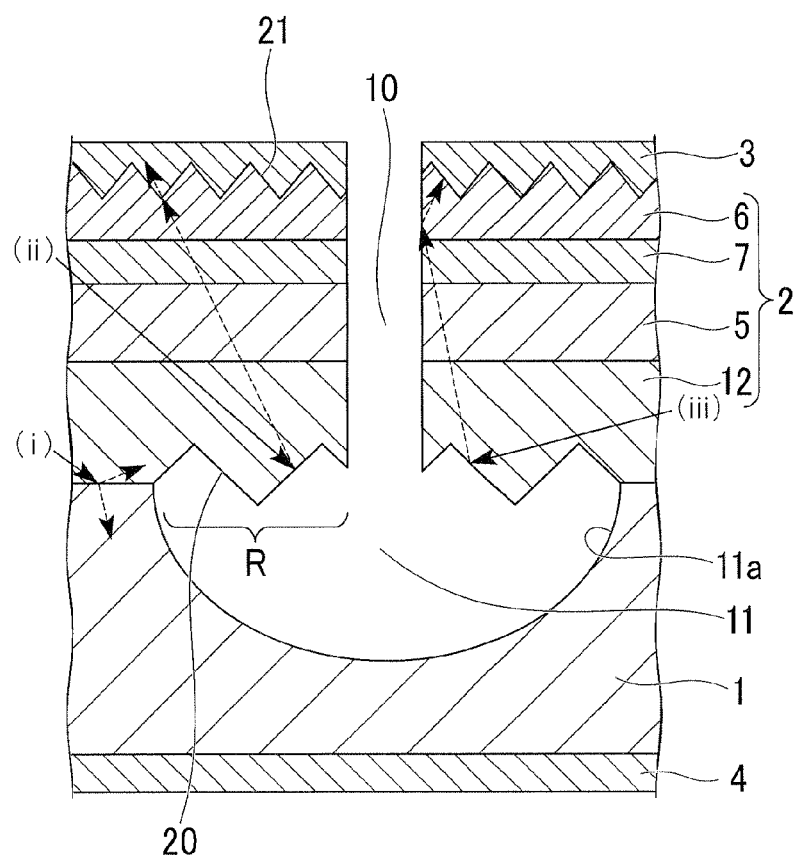
FIG. 5 is a detailed sectional structure of the active layer forming part 2 and the hollow part 11 in the area S in FIG. 1, in the first (or second) embodiment.

The effect obtained by the first uneven pattern 20 formed at the boundary surface R will be explained with reference to FIG. 5. FIG. 5 is an enlarged view of an area S in FIG. 1, and is a schematic diagram for showing the form of the first uneven pattern 20 (which has grooves, each having an inverse pyramid form, here).

As shown in FIG. 5, among light emitted downward from the active layer 7, a light portion reaches an area "(i)", that is, not the boundary surface R but a boundary surface between the active layer forming part 2 and the conductive substrate 1. A part of this light portion is reflected by the boundary surface, and the other is incident on the conductive substrate 1, which is transformed into heat and thus is consumed.

On the other hand, a light portion, which reaches an area "(ii)", is reflected by the boundary surface R, so that the direction thereof is changed. In this process, as the first uneven pattern 20 is formed on the boundary surface R, and has faces which are inclined with respect to the main surface 1a of the conductive substrate 1, a larger amount of light (which is incident from above) is reflected (i.e., a larger amount of light deflects). As a result, the amount of light, whose direction is changed to the upward direction, increases, thereby improving the light extraction efficiency, that is, the light-emitting efficiency with respect to the light emitted from the active layer 7, in comparison with the conventional devices.

On the other hand, a light portion, which is incident on the boundary surface between the first electrode 3 (i.e., a transparent electrode) and the active layer forming part 2 at an incident angle greater than or equal to a critical angle with respect to relevant reflection, is reflected by this boundary surface, so that it is not emitted as emitted light from the semiconductor light-emitting device to the outside.

For example when the second cladding layer 6 is made of GaN, light, which is incident at an angle greater than or equal to the critical angle, is reflected by the boundary surface between the first electrode 3 and GaN due to a difference between the refractive indices thereof.

Figure 6:
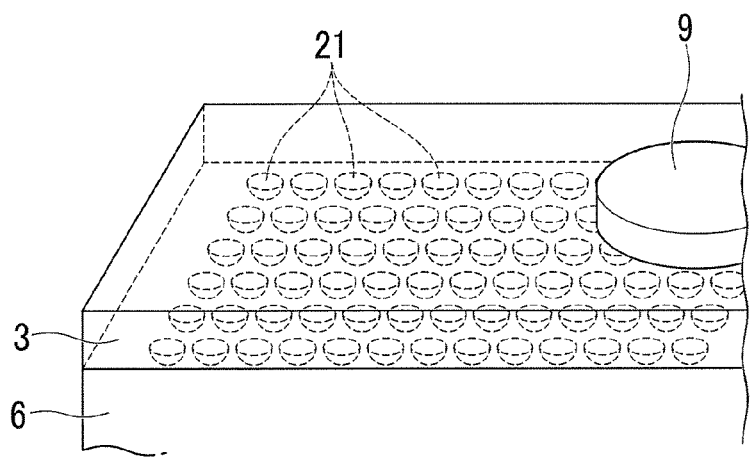
FIG. 6 is a schematic diagram showing the arrangement of the second uneven pattern 21 of the semiconductor light-emitting device in the first embodiment.

Therefore, it is preferable to form a second uneven pattern 21, formed by numerous pits (see FIG. 6), at a boundary surface between the first electrode 3 (i.e., a transparent electrode) and the second cladding layer 6 (i.e., the active layer forming part 2).

That is, the lower surface of the first electrode 3 (i.e., a transparent electrode) is uneven. When such a second uneven pattern 21 is formed at a boundary surface between the first electrode 3 and the active layer forming part 2, the incident angle of the light can be smaller than the above critical angle, depending on the angle of each side face of the second uneven pattern 21. Therefore, it is possible to prevent light from being reflected by the boundary surface between the first electrode 3 and the active layer forming part 2, and thus to efficiently provide light (which is emitted from the active layer 7) to the outside of the semiconductor light-emitting device.

In contrast with the arrangement of the first uneven pattern 20 so as to reflect a larger amount of light, it is important to arrange the second uneven pattern 21 so as to provide a larger amount of light, which reaches the boundary surface between the first electrode 3 and the active layer forming part 2, with an incident angle smaller than the critical angle. Therefore, with regard to hemispherical forms of the second uneven pattern 21, the width between adjacent hemispherical recessed parts should be smaller in comparison with the first uneven pattern 20, that is, the alternation with respect to the peak-valley form should be repeated at smaller intervals, and peak portions and valley portions in the peak-valley form should be formed at a high density.

As shown in FIG. 5, the second uneven pattern 21 formed at the first electrode 3 may be formed only at the lower surface of the first electrode 3. In contrast, it may be formed (i) only at the upper surface of the first electrode 3, or (i) at both the upper and lower surfaces of the first electrode 3.

In accordance with the above structure, as shown by the reference symbol "(iii)" in FIG. 5, a part of the light, which is reflected by the boundary surface R between the hollow part 11 and the active layer forming part 2 so as to change the light direction from the downward direction, is further reflected by a side face of the relevant hole 10, so that the light direction is further changed and the light reaches the boundary surface between the first electrode 3 and the active layer forming part 2.

As the boundary surface between the first electrode 3 and the active layer forming part 2 has the second uneven pattern 21, the amount of light, whose incident angle is smaller than the critical angle increases, so that a larger amount of light, having an incident angle smaller than the critical angle, can exit to the outside of the semiconductor light-emitting device.

When the density of the hollow parts 10 is higher in the vicinity of the pad electrode 9 (see FIG. 3) in comparison with the peripheral (i.e., outer) side of the semiconductor light-emitting device, the amount of light reflected by the side face of the relevant hollow parts 10 increases, thereby reducing light which is positioned immediately below the pad electrode 9 and is blocked by the pad electrode 9.

If the hollow parts 11 are also arranged as shown in FIG. 3, light, which is emitted downward immediately below the pad electrode 9, is reflected by the boundary surface R between the relevant hollow parts 11 and the active layer forming part 2, and the reflected light passes without being reflected by the second uneven pattern 21. Therefore, in comparison with conventional techniques, the light extraction efficiency can be further increased.

Figure 7:
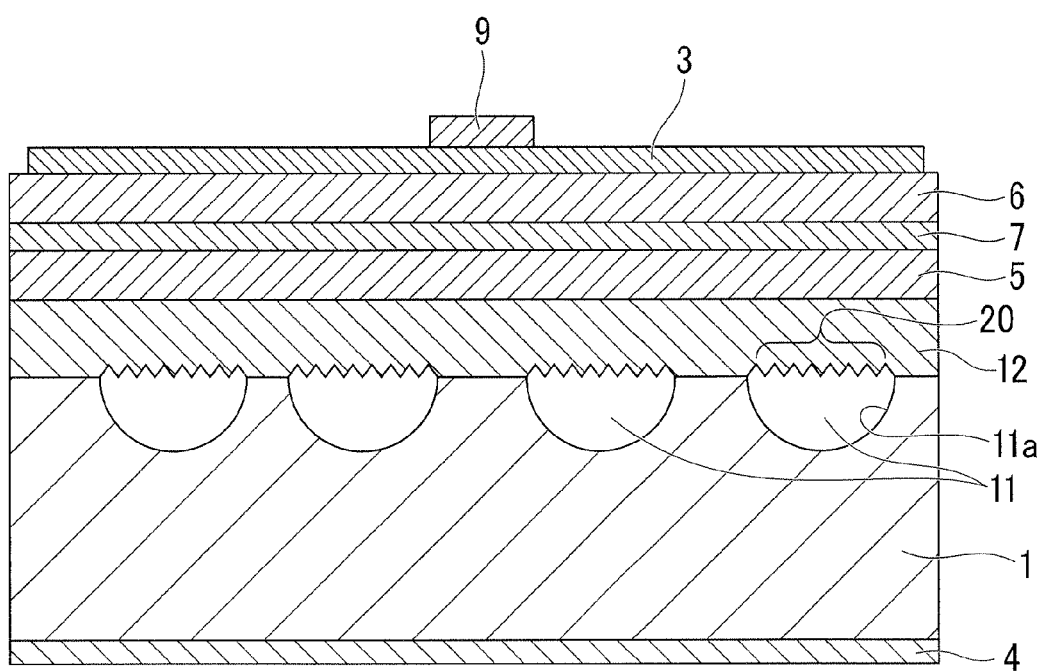
FIG. 7 is a schematic diagram showing a sectional structure (along line B-B in FIG. 4) of the semiconductor light-emitting device in the first embodiment.

FIG. 1 is a sectional view along line A-A in FIG. 4, and FIG. 7 is a sectional view along line B-B in FIG. 4. As shown in FIG. 7, the sectional structure along line B-B in FIG. 4 has no holes 10.

Below, with reference to FIGS. 8A to 8F, the method of manufacturing the semiconductor light-emitting device in the present embodiment will be explained.

First, on the main surface 1a of the conductive substrate 1a, the buffer layer 12, the first cladding layer 5, the active layer 7, and the second cladding layer 6 are formed by a known MOCVD (metal organic chemical vapor deposition) method.

When forming a first buffer layer which belongs to the buffer layer 12, an AlN layer having a specific thickness is formed by pouring TMA (trimethyl aluminum) and ammonia at a specific ratio into a reaction chamber. When forming a second buffer layer which also belongs to the buffer layer 12, a GaN layer having a specific thickness is formed by pouring TMG (trimethyl gallium) and ammonia at a specific ratio.

On the buffer layer 12, the first cladding layer 5, the active layer 7, and the second cladding layer 6 are stacked one after another.

On the entire surface of the second cladding layer 6, an ITO layer (functioning as the first electrode 3) is deposited, which forms a low-resistance (i.e., Ohmic) contact together with the second cladding layer 6, by vacuum evaporation, sputtering, or CVD. After the first electrode 3 is formed as described above, annealing is performed (see FIG. 8A). Here, a metal layer for forming the pad electrode 9 is deposited by vapor deposition after the electrode 3 is formed, and then the annealing is performed.

Next, in order to form the recessed parts 11a, an oxide film 41 made of $SiO_2$ is selectively formed in advance on the layer which functions as the pad electrode 9 in a manner such that openings are formed at areas corresponding to the center of each recessed part 11a (see FIG. 8B), and then dry etching is performed by reactive ion etching (RIE), by using the oxide film 41 as an etching mask. Accordingly, the holes 10, each having a U-shaped section, are formed, which pass through the pad electrode 9, the first electrode 3, the active layer forming part 2, and the buffer layer 12, and reach the main surface 1a of the conductive substrate 1. The width of each hole 10 is 200 nm to 100 μm, preferably, 1 to 3 μm. At the bottom of each hole 10, the surface of the conductive substrate 1 is exposed (see FIG. 8C).

In the next step, the oxide film 41 is removed, and the pad electrode 9 is shaped by etching so as to have a specific form (in the present embodiment, so as to position at a center part of the device). Next, an oxide film 42 made of $SiO_2$ is selectively formed. Accordingly, the surface of the conductive substrate 1 corresponding to the bottom face of each hole 10 is exposed, while the side face of each hole 10, the exposed pad electrode 9, and the exposed first electrode 3 are covered with the oxide film 42 (see FIG. 8D).

In the next step, the surface of the conductive substrate 1, which is exposed due to formation of the holes 10, is etched using an etchant (e.g., a mixed liquid of hydrofluoric acid (HF) and nitric acid ($HNO_3$) in the case when the conductive substrate 1 is a silicon substrate). Accordingly, the hollow parts 11a are formed, each of which expands from each exposed part of the conductive substrate 1 (which is exposed by the formation of the corresponding hole 10, and functions as the center of expansion), toward the inside of the conductive substrate 1 in substantially equal directions. That is, each recessed part 11a is also formed immediately under the active layer forming part 2 (see FIG. 8E). Accordingly, each hole 10 and the hollow part 11 join each other, and each boundary surface R is formed between the lower surface of the active layer forming part 2 and the corresponding hollow part 11.

In the next step, with regard to the surface of the buffer layer 12 (or the active layer forming part 2 when no buffer layer 12 is provided: this alternative condition is also effective in the following explanation), each area which contacts a hollow part 11 and faces the corresponding recessed part 11a, that is, a part of the lower surface of the buffer layer 12, which is exposed due to each recessed part 11a and thus is an upper surface of the hollow part 11, has a rough surface having a multiple peak-valley form 14 (i.e., the first uneven pattern 20) consisting of peak portions and valley portions which are alternately arranged.

If the boundary surface R under the active layer forming part 2 is flat, light, which is emitted downward from the active layer forming part 2, is not reflected unless the incident angle with respect to the hollow part 11 (i.e., air) is greater than or equal to the specific critical angle. However, in the semiconductor light-emitting device of the present embodiment, as the above multiple peak-valley form 14 is formed on the lower surface of the active layer forming part 2, it is possible to increase the amount of light, which is reflected by deflection, and thus to improve the light extraction efficiency.

In order to form the multiple peak-valley form 14, after the boundary surface R is formed, etching is performed using an etchant which is a phosphoric acid ($H_3PO_4$) or a solution of potassium hydroxide (KOH), which is heated to 70° C. As the etching speed of $SiO_2$, which forms the oxide film 42, is lower than that of a III-V compound semiconductor, which forms the buffer layer 12 (or the active layer forming part 2 (i.e., a light-emitting part)), the oxide film 42 is not etched. However, the multiple peak-valley form 14 is formed on the surface of the III-V compound semiconductor layer (i.e., the buffer layer 12 or the active layer forming part 2), which is exposed due to the recessed parts 11a (see FIG. 8F).

The oxide film 42 on the pad electrode 9 is then removed, thereby forming the semiconductor light-emitting device of the present embodiment.

Figure 8A:
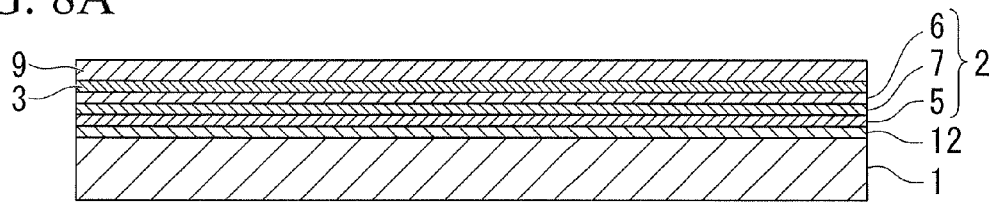
FIGS. 8A to 8F are schematic sectional views for explaining the method of manufacturing the semiconductor light-emitting device of the first embodiment.
Figure 8B:
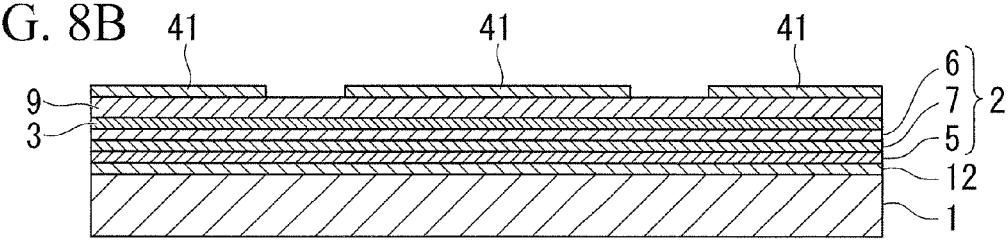
Figure 8C:
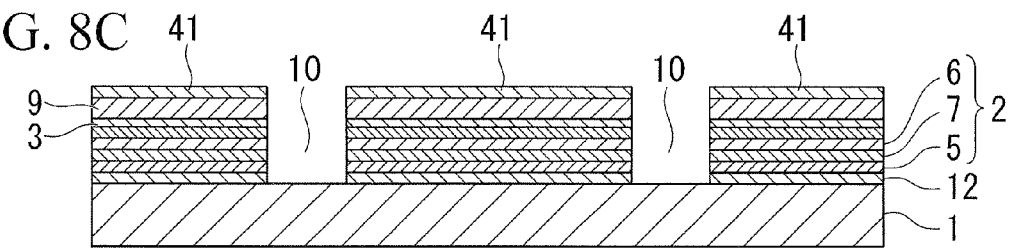
Figure 8D:
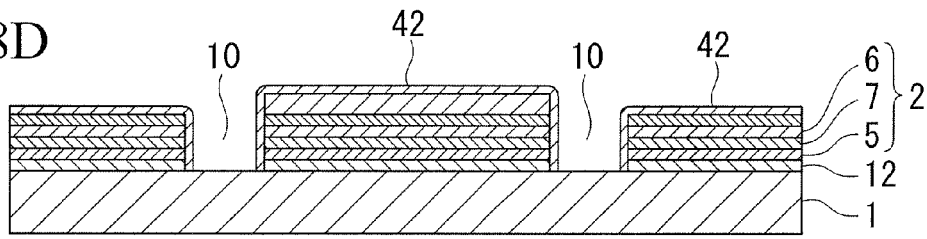
Figure 8E:
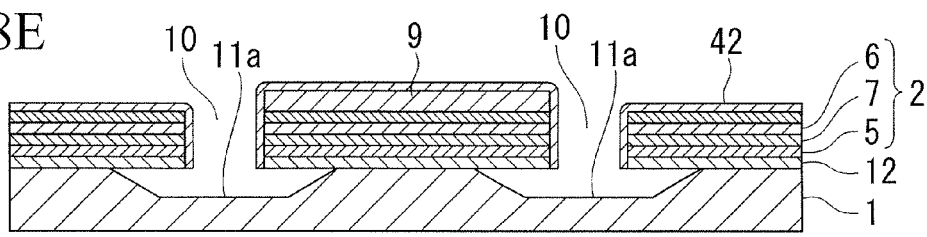
Figure 8F:
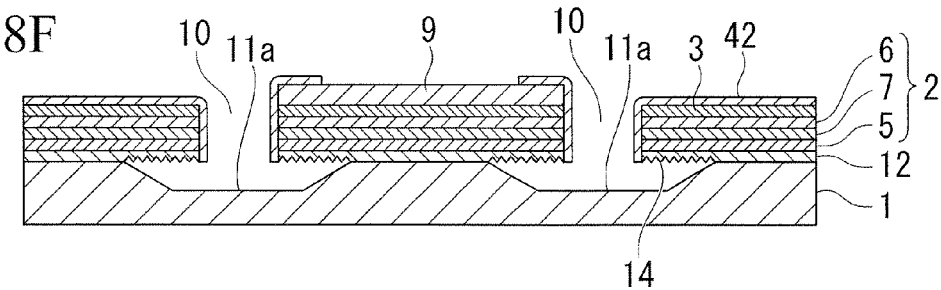

In the above-described structure, when the second uneven pattern 21 is formed at the boundary surface between the first electrode 3 and the second cladding layer 6, a film made of a III-V compound semiconductor is formed as the second cladding layer 6 in the process shown by FIG. 8A. On the upper surface of the second cladding layer 6, a high-polymer material, which is a combination of polystyrene and poly(methyl methacrylate), is deposited so as to have a thickness corresponding to the height of the second uneven pattern 21, and then the present device is heated at a predetermined temperature (e.g., approximately 250° C.).

The poly(methyl methacrylate) is then etched using an oxygen plasma, so that solidification areas of self-organized polystyrene remain in dotted form.

When the exposed second cladding layer 6 is etched using the solidification areas of polystyrene by a specific depth, the second cladding layer 6 is provided, on which a fine uneven pattern is formed. On this second cladding layer 6 having the second uneven pattern 21, a film functioning as the first electrode 3 is formed.

In the present embodiment, as the first uneven pattern 20 is formed at the boundary surface R between each hollow part 11 and the active layer forming part 2, the angle at which light is directed is changed, thereby increasing the amount of light having an incident angle within the critical angle with respect to the boundary surface between the first electrode 3 and the active layer forming part 2. Therefore, it is possible to reduce the amount of light, which is reflected by the boundary surface between the first electrode 3 and the active layer forming part 2, and thus to increase the amount of light, which is output to the outside of the semiconductor light-emitting device. Accordingly, the light emitted by the active layer 7 is more efficiently extracted from the semiconductor light-emitting device.

That is, in accordance with the first embodiment, the light-emitting efficiency can be improved in comparison with conventional devices.

Second Embodiment

The structure of a semiconductor light-emitting device as a second embodiment of the present invention will be explained with reference to FIGS. 9A and 9B. FIG. 9A is a diagram showing a sectional structure of the semiconductor light-emitting device of the second embodiment and FIG. 9B is an enlarged view of a part 500 in FIG. 9A. In FIGS. 9A and 9B, parts similar to those in the first embodiment are given identical reference numerals, and explanations thereof are omitted. More specifically, the second embodiment has a structure similar to the first embodiment, except for a part of the conductive substrate 1 and a part where a protective element is formed, immediately under a pad electrode 9. The structure in plan view is similar to those shown in FIGS. 2 to 4 because a protective-element forming area is covered by the pad electrode 9.

The present embodiment relates to a composite semiconductor device which includes a semiconductor light-emitting device and a protective element for protecting it. A light-emitting element having an active layer forming part 2 which uses a compound semiconductor has a relatively small breakage resistance with respect to static electricity. Therefore, when, for example, a surge voltage higher than 100 V is applied, the light-emitting element may be broken. Therefore, in order to protect the semiconductor light-emitting element from static electricity, a protective element such as a diode or a capacitor may be installed in the same package together with the light-emitting element.

In FIG. 9A, impurities having a first conductive type (for forming a p-type semiconductor) are doped in the conductive substrate 1. A recessed part 30 is formed in the active layer forming part 2, so as to expose a part of the conductive substrate 1. Impurities having a second conductive type (for forming an n-type semiconductor) are doped from the surface of the exposed conductive substrate 1, thereby forming a semiconductor area 40 (i.e., an impurity diffusion area) as an impurity area having a conductive type different from that of the conductive substrate 1.

The composite semiconductor device of the present embodiment includes a light-emitting diode as a light-emitting element, and a Schottky barrier diode as a protective element. In a light-emitting element forming area 200 in FIG. 9A, a part formed by the active layer forming part 2, the first electrode 3, and the second electrode 4 can be called a light-emitting element (part). On the other hand, in a protective-element forming area 100 in FIG. 9A, a pn diode formed by a contact between the semiconductor area 40 and the conductive substrate 1 can be called a protective element.

The conductive substrate 1 functions as (electric) current flowing passages of the light-emitting element and the protective element. That is, the semiconductor area 40 at the center of the conductive substrate 1 functions as a main portion of the pn diode, and also functions as a current passage thereof. The light-emitting element forming area 200 of the conductive substrate 1, in which a light-emitting element for surrounding the semiconductor area 40 is formed, functions as a current passage of the light-emitting element.

In addition, an insulating film 50 is formed on the side face of the recessed part 30, by which a second part 3a of the first electrode 3, which contacts the semiconductor area 40, is not electrically connected to the active layer forming part 2. Additionally, a part of the bottom face of the insulating film 50 is open so that a part of the recessed part 30 functions as a contact area. That is, a contact hole is formed so as to expose at least a part of the upper surface of the semiconductor area 40. Accordingly, the second part 3a of the first electrode 3 is electrically connected to the semiconductor area 40.

The exposed part of the semiconductor area 40 and the second part 3a of the first electrode 3 form a low-resistance (i.e., Ohmic) connection.

In order to electrically connect the second part 3a and a first part 3b (which corresponds to the first electrode 3 in the first embodiment) of the first electrode 3) the second part 3a is formed in a manner such that it is larger (i.e., extends more outward) than the insulating film 50 in plan view.

The pad electrode 9 is formed inside the recessed part 30. In the structure of the light-emitting element in the second embodiment, the protective-element forming area 100 for improving the electrostatic resistance of the light-emitting element is formed immediately below the pad electrode 9) by means of the pn Junction of the conductive substrate 1 and the semiconductor area 40. Additionally, the second embodiment has the structure of a composite semiconductor device, in which (i) the holes 10 and the corresponding hollow parts 11 for changing the light proceeding direction are formed with respect to the active layer forming part 2 in the light-emitting element forming area 200 in a manner such that they spread outward from the pad electrode 9 in a honeycomb form, and (ii) the protective-element forming area 100 is provided at the center of the semiconductor device.

When forming the light-emitting element of the second embodiment, the holes 10 and the recessed part 30 may be formed simultaneously.

Instead of forming the pn junction as a protective element by using the conductive substrate 1 and the semiconductor area 40, that is, instead of forming the semiconductor area 40, a Schottky electrode for forming a Schottky contact on the conductive substrate 1 may be formed in the area where the second part 3a of the first electrode 3 contacts the conductive substrate 1, that is, between the second part 3a of the first electrode 3 and the conductive substrate 1 (see FIG. 9A).

Such a Schottky electrode for forming a Schottky contact, that is, a Schottky contact metal layer may be formed using titanium (Ti), platinum (Pt), chromium (Cr), aluminum (Al), samarium (Sm), platinum silicide (PtSi), palladium silicide ($Pd_2Si$), or the like, and forms a Schottky contact together with the surface of the conductive substrate 1 through the contact hole, which is formed through the insulating film 50. As described above, the Schottky barrier diode as a protective element is formed using the conductive substrate 1 and a Schottky electrode.

In plan view, the pad electrode 9 (i.e., a bonding pad) is formed inside the second part 3a of the first electrode 3, so as to have a smaller surface area than that of the active layer forming part 2. The pad electrode 9 is made of metal, to which an external connection wire made of aluminum (Al) or gold (Au) can be connected. In addition, the pad electrode 9 is connected to the second part 3a of the first electrode 3, and also to the semiconductor area 40 (or the above-described Schottky electrode) via the second part 3a of the first electrode 3. In addition, the pad electrode 9 (the bonding pad) is connected to the active layer forming part 2 via the first part 3b and the second part 3a of the first electrode 3.

In plan view, that is, when observed in a direction perpendicular to the main surface 1a of the conductive substrate 1, the pad electrode 9 covers at least an inner part of the active layer forming part 2 and at least a part of the protective-element forming area 100, and does not cover an outer part of the active layer forming part 2. When the above Schottky electrode is provided, the pad electrode 9 is formed in a manner such that the second part 3a of the first electrode 1 is connected to the above Schottky electrode.

In plan view, the protective-element forming area 100 is arranged inside the pad electrode 9. However, even if the protective-element forming area 100 protrudes to the outside of the pad electrode 9 in plan view, the function of the protective element is not lowered.

The second electrode 4 is formed using a metal layer, and on the entire surface of the main surface 1b of the conductive substrate 1, similar to the first embodiment. That is, the second electrode 4 forms an Ohmic contact together with the lower surface of the conductive substrate 1 in both the protective-element forming area 100 and the light-emitting element forming area 200.

Figure 10:
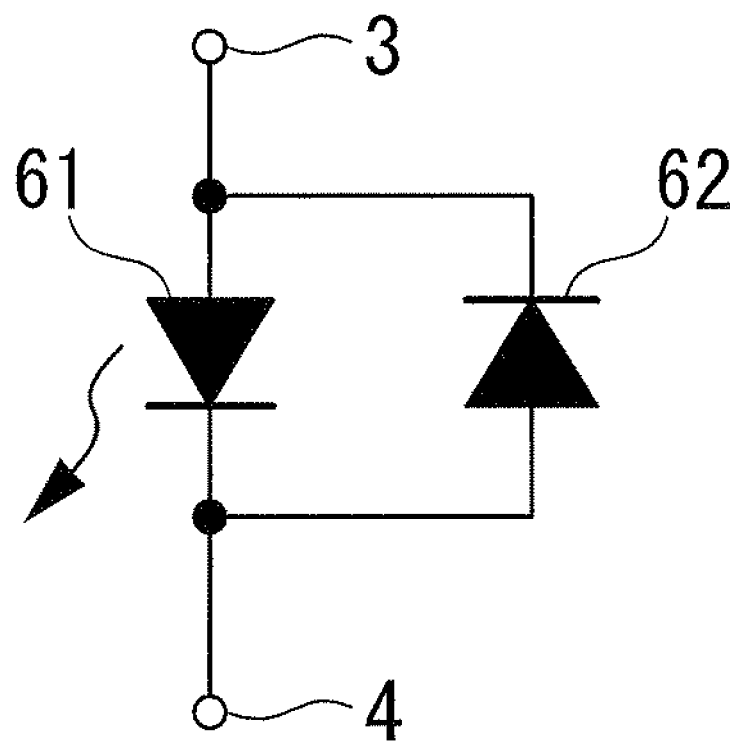
FIG. 10 is a schematic diagram showing an equivalent circuit of the composite semiconductor device in the second embodiment.

The pad electrode 9 functions as an external connection electrode of a light-emitting element, and also has a function of connecting the semiconductor area 40 of a pn junction diode (or a Schottky electrode of a Schottky barrier diode) to the light-emitting element. The second electrode 4 functions as electrodes of both the light-emitting element and the protective element. Therefore, the composite semiconductor device shown in FIG. 9 functions as an inverse-parallel connection circuit (see FIG. 10) including a light-emitting diode 61 as a light-emitting element and a Schottky barrier diode 62 as a protective element.

The Schottky barrier diode 62 conducts electricity when an excess reverse voltage (e.g.) a surge voltage) higher than a predetermined value is applied to the light-emitting diode 61. Accordingly, the voltage of the light-emitting diode 61 is limited to the forward voltage of the Schottky barrier diode 62, and the light-emitting diode 61 is protected from an excess reverse voltage due to static electricity or the like.

The forward voltage of the Schottky barrier diode 62 for starting electric conduction is set to be lower than or equal to a permissive maximum reverse voltage of the light-emitting diode 61, that is, lower than a voltage by which the light-emitting diode 61 may be broken. Preferably, the forward voltage of the Schottky barrier diode 62 for starting electric conduction is higher than a reverse voltage applied to the light-emitting diode 61 in a normal state, and lower than a voltage by which the light-emitting diode 61 may be broken.

In accordance with the above structure, in addition to the effects obtained by the first embodiment, the semiconductor light-emitting device of the second embodiment can form a protective element for improving the electrostatic, resistance of the device without reducing the area for light extraction. Therefore, it is possible to provide a small-sized light-emitting element including a protective element (i.e., a composite semiconductor device.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A semiconductor light-emitting device comprising:
   a substrate having two main surfaces; and
   an active layer forming part, which is made of a compound semiconductor material, formed on one of the main surfaces, and includes an active layer, wherein:
   a plurality of holes, which pass through the active layer, are formed from the upper surface to the lower surface of the active layer forming part;
   a plurality of hollow parts, each of which corresponds to each hole, are provided between the active layer forming part and the substrate;
   the area of each hollow part is larger than that of the corresponding hole in plan view, and spreads on the lower surface of the active layer forming part, so as to expose a part of the lower surface of the active layer forming part, which overlaps the hollow part in plan view;
   light emitted from the active layer is reflected by a boundary surface between each of the hollow parts and the corresponding exposed part of the lower surface of the active layer forming part;
   a pad electrode is provided on the upper surface of the active layer forming part; and
   in plan view, the density of the hollow parts is higher in the vicinity of the pad electrode, in comparison with a peripheral area of the semiconductor light-emitting device.

2. The semiconductor light-emitting device in accordance with claim 1, wherein:
   each hollow pad joins the corresponding hole; and
   in plan view, the adjacent hollow parts in each direction from the pad electrode toward a side away therefrom contact each other.

3. The semiconductor light-emitting device in accordance with claim 1, wherein the substrate does not transmit the light emitted from the active layer.

4. The semiconductor light-emitting device in accordance with claim 1, wherein:
   the substrate is a silicon substrate; and
   the active layer forming part is made using a nitride compound semiconductor.

5. The semiconductor light-emitting device in accordance with claim 1, wherein:
   on the exposed part in the lower surface of the active layer forming part, a first uneven pattern having a multiple alternating peak-valley form is formed.

6. The semiconductor light-emitting device in accordance with claim 5, wherein:
   a transparent electrode is provided on the upper surface of the active layer forming part, and
   the transparent electrode has a surface which includes a second uneven pattern having a multiple alternating peak-valley form, wherein in plan view, the width between each peak and its adjacent valley in the multiple alternating peak-valley form of the second uneven pattern is smaller in comparison with the first uneven pattern.

7. The semiconductor light-emitting device in accordance with claim 1, wherein:
   the pad electrode is formed substantially at the center of the semiconductor light-emitting device in plan view;
   a protective element for protecting the semiconductor light-emitting device from a high voltage which may break the device is formed below the pad electrode; and
   the active layer forming part is formed around the protective element.

* * * * *